United States Patent
Ooi et al.

(10) Patent No.: US 7,358,114 B2
(45) Date of Patent: Apr. 15, 2008

(54) SEMICONDUCTOR DEVICE SUBSTRATE, SEMICONDUCTOR DEVICE, AND MANUFACTURING METHOD THEREOF

(75) Inventors: Kiyoshi Ooi, Nagano (JP); Yasuyoshi Horikawa, Nagano (JP); Akio Rokugawa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 381 days.

(21) Appl. No.: 11/257,263

(22) Filed: Oct. 24, 2005

(65) Prior Publication Data

US 2006/0040424 A1  Feb. 23, 2006

Related U.S. Application Data

(62) Division of application No. 10/811,768, filed on Mar. 29, 2004.

(30) Foreign Application Priority Data

Apr. 8, 2003 (JP) .............................. 2003-104070

(51) Int. Cl.
*H01L 21/00* (2006.01)
(52) U.S. Cl. .................... 438/106; 438/108; 438/616
(58) Field of Classification Search ................ 438/106, 438/108, 616
See application file for complete search history.

(56) References Cited

FOREIGN PATENT DOCUMENTS

| JP | 4283987 | 10/1992 |
|---|---|---|
| JP | 2003197809 | 7/2003 |

*Primary Examiner*—Douglas M. Menz
(74) *Attorney, Agent, or Firm*—Ladas & Parry LLP (57) ABSTRACT

A method of manufacturing a semiconductor device substrate includes the steps of: arranging on a base a temporary fixing member for temporarily fixing an electronic component; temporarily fixing the electronic component on the base by the temporary fixing member; forming a substrate body on the base and the electronic component; removing a portion of the base which portion corresponds to the electronic component, thereby exposing the temporary fixing member; and removing the temporary fixing member, thereby enabling the electronic component to make an external connection.

9 Claims, 12 Drawing Sheets

FIG.7

SEMICONDUCTOR DEVICE SUBSTRATE, SEMICONDUCTOR DEVICE, AND MANUFACTURING METHOD THEREOF

BACKGROUND OF THE INVENTION

1. Field of the Invention

The present invention generally relates to manufacturing methods of a semiconductor device substrate, semiconductor device substrates, and semiconductor devices, and more particularly, to a semiconductor device substrate having a base that supports a substrate body and includes an opening at a position (portion) where a semiconductor element is mounted, a manufacturing method of a semiconductor device substrate, and a semiconductor device.

2. Description of the Related Art

Recently, with the increase in the operational frequency of a semiconductor element mounted on a semiconductor device, it is becoming necessary to stabilize a power supply voltage supplied to such a semiconductor element. In order to correspond to the need, a structure is proposed in which an electronic component such as a capacitor element is provided in a semiconductor device substrate (a substrate for a semiconductor device) on which a semiconductor element is mounted (refer to Japanese Laid-Open Patent Application No. 04-283987, for example).

However, there are problems in semiconductor devices (semiconductor device substrates) having conventional structures in that manufacturing process thereof becomes complicated, electric properties thereof are degraded, and formation of connecting terminals becomes difficult, for example.

SUMMARY OF THE INVENTION

A general object of the present invention is to provide an improved and useful manufacturing method of a semiconductor device substrate, a semiconductor device substrate, and a semiconductor device in which one or more of the above-mentioned problems are eliminated.

Another and more specific object of the present invention is to provide a manufacturing method of a semiconductor device substrate, a semiconductor device substrate, and a semiconductor device that can simplify a manufacturing process and improve characteristics of a semiconductor device.

In order to achieve the above-mentioned objects, according to one aspect of the present invention, there is provided a method of manufacturing a semiconductor device substrate, the method including the steps of:

arranging on a base a temporary fixing member for temporarily fixing an electronic component;

temporarily fixing the electronic component on the base by using the temporary fixing member;

forming a substrate body on the base and the electronic component;

removing a portion of the base which portion corresponds to the electronic component, thereby exposing the temporary fixing member; and removing the temporary fixing member, thereby enabling the electronic component to make an external connection.

According to an aspect of the invention, when arranging an electronic component on a base, instead of fixing the electronic component to the base by soldering, the electronic component may be temporarily fixed to the base by using a temporary fixing member. The temporary fixing member used for temporarily fixing the electronic component to the base may be removed after forming an opening in the base at a portion where the electronic component is arranged. Hence, the need for providing connecting terminals for soldering the electronic component to the base may be eliminated. The need for positioning the connecting terminals and the electronic component may also be eliminated. Accordingly, it is possible to easily manufacture a semiconductor device substrate.

According to an embodiment of the invention, the temporary fixing member may be made of a metal.

In an embodiment of the invention, the metal may be a low-melting metal.

In an embodiment of the invention, the temporary fixing member may be a sheet member configured to be able to bond the electronic component to the base.

In an embodiment of the invention, the sheet member may be a member selected from the group consisting of a thermo peeling tape, a water-soluble sheet, and a UV tape.

In an embodiment of the invention, the temporary fixing member may be a liquid adhesive.

Various materials may be used for the temporary fixing member. It is possible to suitably select a material of the temporary fixing member in accordance with characteristics of the electronic component.

According to another aspect of the present invention, there is provided a semiconductor device substrate including:

a base having an opening formed therein;

an electronic component; and a substrate body arranged on the base and holding the electronic component, wherein the opening of the base is formed at a portion corresponding to the electronic component, and wherein the electronic component includes an electrode made of a single conductive material exposed at the opening.

According to yet another aspect of the invention, there is provided a semiconductor device substrate including:

a base having an opening formed therein;

an electronic component; and a substrate body arranged on the base and holding the electronic component, wherein the opening of the base is formed at a portion corresponding to the electronic component, wherein the electronic component includes an electrode exposed to the opening, and wherein the substrate body has a cavity therein adjacent to the opening to which the electrode is exposed.

According to still another aspect of the invention, an electrode of an electronic component may project from a surface of a substrate body, thereby making it possible to directly connect a semiconductor device to the electrode. Hence, it is possible to reduce impedance between the electronic component and the semiconductor element, and to improve electric properties of the semiconductor device.

According to another aspect of the present invention, there is provided a semiconductor device including:

a semiconductor device substrate including:

a base having an opening formed therein;

an electronic component; and a substrate body arranged on the base and holding the electronic component, wherein the opening of the base is formed at a portion corresponding to the electronic component, and wherein the electronic component includes an electrode made of a single conductive material; and a semiconductor element mounted on the semiconductor device substrate and electrically connected to the electrode of the electronic component.

According to a further aspect of the invention, there is provided a semiconductor device including:

a semiconductor device substrate including:

a base having an opening formed therein;

an electronic component; and a substrate body arranged on the base and holding the electronic component, wherein the opening of the base is formed at a portion corresponding to the electronic component, wherein the electronic component includes an electrode, and wherein the substrate body has a cavity therein adjacent to the opening; and a semiconductor element mounted on the semiconductor device substrate and electrically connected to the electrode of the electronic component.

According to still another aspect of the invention, an electrode of an electronic component may project from a surface of the substrate body, thereby making it possible to directly connect a semiconductor device to the electrode. Hence, it is possible to reduce impedance between the electronic component and the semiconductor element, and to improve electric properties of the semiconductor device.

Other objects, features and advantages of the present invention will become more apparent from the following detailed description when read in conjunction with the following drawings.

DETAILED DESCRIPTION OF THE PREFERRED EMBODIMENTS

FIGS. 1A through 1H are schematic diagrams for explaining a manufacturing method of a semiconductor device substrate and a semiconductor device suggested by the inventors of the present invention.

Figure 1A:
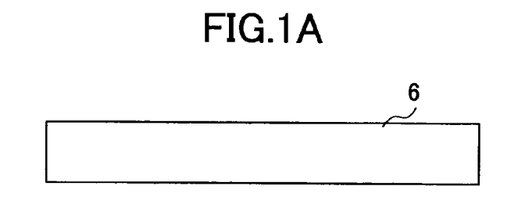
FIGS. 1A, 1B, 1C, 1D, 1E, 1F, 1G, and 1H are schematic diagrams for explaining a manufacturing method of a semiconductor device substrate, the semiconductor device substrate, and a semiconductor device.
Figure 1B:
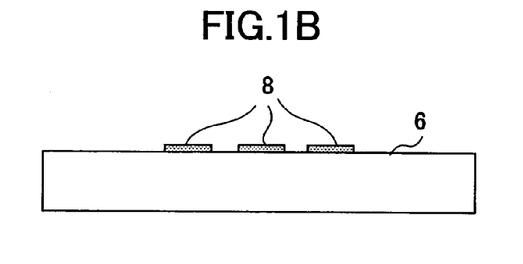
Figure 1C:
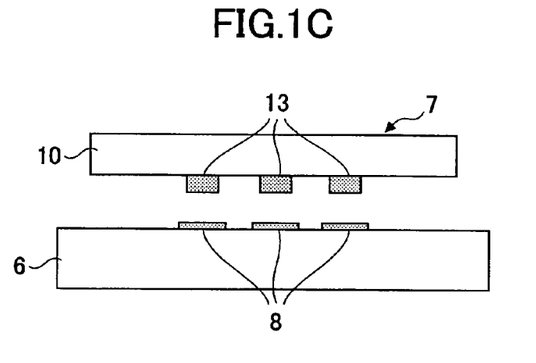
Figure 1D:
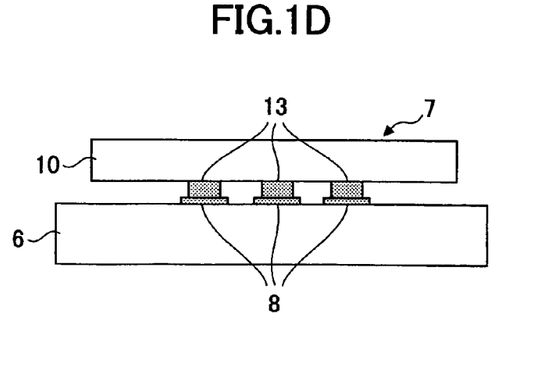
Figure 1E:
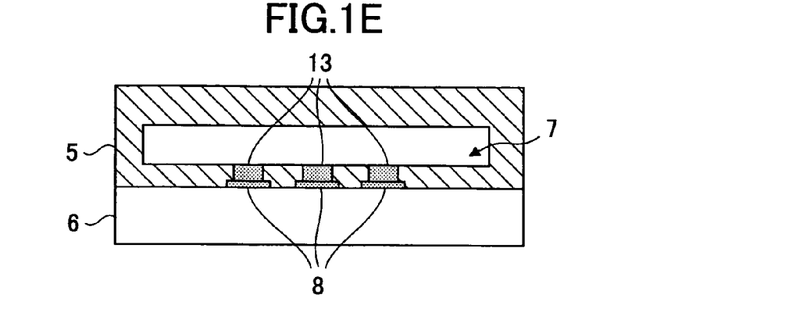
Figure 1F:
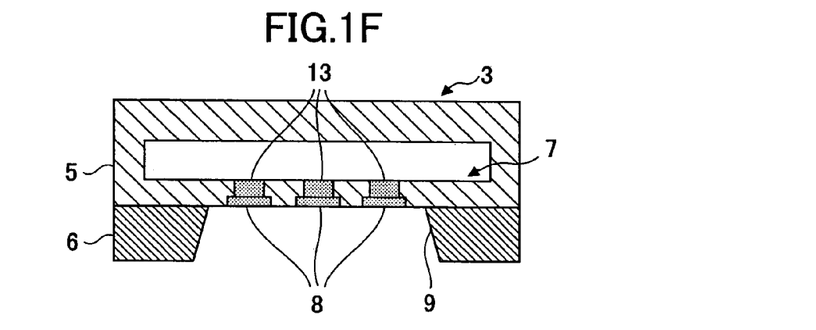
Figure 1G:
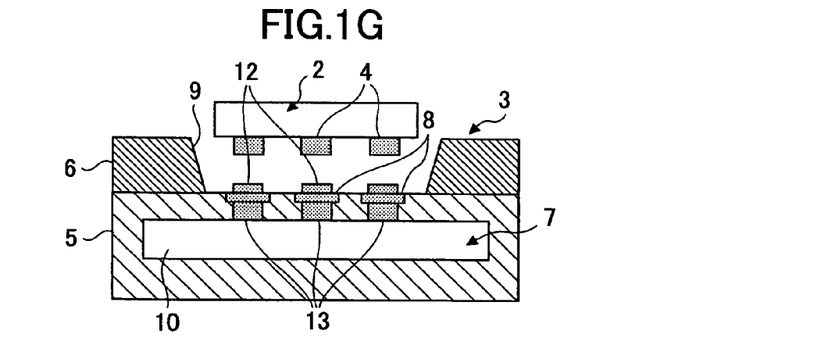
Figure 1H:
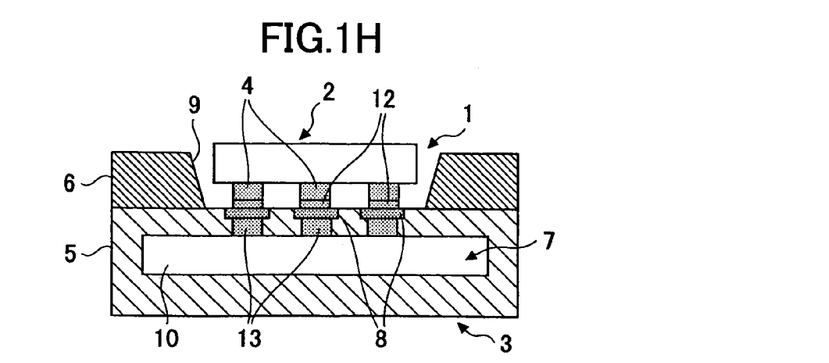

FIG. 1H shows a semiconductor device 1 provided with an electronic component, and a semiconductor device substrate (hereinafter simply referred to as a "substrate") 3. In the semiconductor device 1 shown in FIG. 1H, a capacitor element is provided as the electronic component.

In the semiconductor device 1, a semiconductor element 2 is mounted in an opening 9 formed in the substrate 3. The substrate 3 includes a substrate body 5, a base 6, and an electronic component 7.

The base 6 is provided for supporting the substrate body 5. For this reason, the base 6 is formed by a metal (copper, for example) having a mechanical strength higher than that of the substrate body 5. The opening 9 is formed in the base 6 at an element mounting position where the semiconductor element 2 is mounted.

The electronic component 7 is embedded in the substrate body 5 except for connecting terminals 8 connected to bumps 13. The electronic component 7 includes a silicon core 10 and the bumps 13 formed on the silicon core 10. The connecting terminals 8 are provided on the bumps 13 (on the exposed sides of the bumps 13). The connecting terminals 8 are exposed at the substrate body 5 in the opening 9.

In order to mount the semiconductor element 2 on the substrate 3, as shown in FIG. 1G, conductive members 12 (solders, for example) are arranged on the connecting terminals 8 exposed at the substrate body 5, and bumps 4 are bonded to the connecting terminals 8 via the conductive members 12. Consequently, the semiconductor element 2 is flip-chip bonded to the substrate 3.

In the semiconductor device 1 having the above-mentioned structure, the electronic component 7, which is a capacitor element, is positioned beneath the semiconductor element 2. Hence, it is possible to stabilize a power supply voltage supplied to the semiconductor element 2 by the electronic component 7 (capacitor element), and improve electric properties and reliability of the semiconductor device 1.

FIGS. 1A through 1G show the manufacturing method of the substrate 3. When manufacturing the substrate 3, the base 6, which is formed by copper (Cu) and shown in FIG. 1A, is prepared. Then, as shown in FIG. 1B, the connecting terminals 8 are formed on the base 6.

Specifically, a conductive metal, which forms the connecting terminals 8, is plated over a top surface of the base 6. Subsequently, a resist is applied and patterning is performed on the resist by using a photo lithography technique. Then, the conductive metal is etched by using the patterned resist as a mask. Thereafter, by performing resist separation, the connecting terminals 8 are formed. The positions where the connecting terminals 8 are formed are selected to correspond to the positions where the bumps 13 are formed on the electronic component 7.

When the connecting terminals 8 are formed on the base 6, subsequently, as shown in FIGS. 1C and 1D, the electronic component 7 is mounted on the base 6. As mentioned above, the electronic component 7 includes the bumps 13 and the silicon core 10 having the capacitor element. The electronic component 7 is manufactured in advance in a process different from the manufacturing process of the substrate 3. Since the bumps 13 are solder bumps, the electronic component 7 is bonded to the base 6.

When the electronic component 7 is mounted on the base 6, as shown in FIG. 1E, the substrate body 5 is formed by stacking the wiring layer such as by vias and an insulating resin member (not shown) by using the build-up method on the side of the base 6 on which the electronic component 7 is mounted. As a result, the electronic component 7 is embedded in the substrate body 5.

Subsequently, as shown in FIG. 1F, the opening 9 is formed in the base 6 at the position where the semiconductor element 2 is to be mounted. Since the opening 9 is formed in the base 6, the connecting terminals 8 that are electrically bonded to the bumps 13 of the electronic component 7 are exposed. Hence, it becomes possible to mount the semiconductor element 2 on the substrate 3. With the series of processes mentioned above, the substrate 3 is manufactured.

In order to mount the semiconductor element 2 on the substrate 3 manufactured as mentioned above, since surfaces of the connecting terminals 8 and a surface of the substrate body 5 form a substantially identical surface, the conductive members 12 are formed on the connecting terminals 8 as shown in FIG. 1G. Subsequently, as shown in FIG. 1H, the semiconductor element 2 is flip-chip bonded to the substrate 3. On this occasion, since the connecting terminals 8 protrude from the bumps 13, it is possible to improve bonding characteristics between the bumps 4 of the semiconductor element 2 and the connecting terminals 8.

As mentioned above, manufacturing methods of the semiconductor device substrate 3 use as a method for fixing the electronic component 7 to the base 6 a method of mounting the electronic component 7 on the connecting terminals 8 after forming the connecting terminals 8 on the base 6

With such a manufacturing method, however, it is inevitably necessary to form the connecting terminals 8 on the base 6. It is also necessary that the formation positions of the connecting terminals 8 match the formation positions of the bumps 13 that are formed on the electronic component 7. Hence, there may be a problem in that the manufacturing process of the substrate 3 may become complicated.

In addition, with the recent increase in the density of a semiconductor element, the number of bumps 4 provided for the semiconductor element 2 shows a tendency to be increased. Accordingly, the number of the bumps 13 formed to correspond to the bumps 4 is also increased, which means it would be desirable to form the connecting terminals 8 on the base 6 with a high density. In this regard, a high degree of accuracy is required in forming the connecting terminals 8. Thus, there may be a problem in that formation of the connecting terminals 8 may become difficult.

Further, with the manufacturing method, as shown in FIGS. 1F through 1H, the connecting terminals 8 remain by necessity. In addition, the connecting terminals 8 form the substantially identical surface with the surface of the substrate body 5 which surface is exposed at the opening 9. Hence, the conductive members 12 are provided on the connecting terminals 8 so as to increase bonding characteristics between the semiconductor element 2 and the connecting terminals 9. Thus, there may be a problem in that the manufacturing process may be complicated.

Additionally, in the structure, as shown in FIG. 1H, two kinds of members, i.e., the connecting terminals 8 and the conductive members 12, lie between the bumps 4 of the semiconductor element 2 and the bumps 13 of the electronic component 7. Hence, impedance between the semiconductor element 2 and the electronic component 7 may become high. Thus, there may be a problem in that electric properties of the semiconductor device 1 may be degraded.

A description is given below of a first embodiment of the present invention, with reference to the drawings.

Figure 2A:
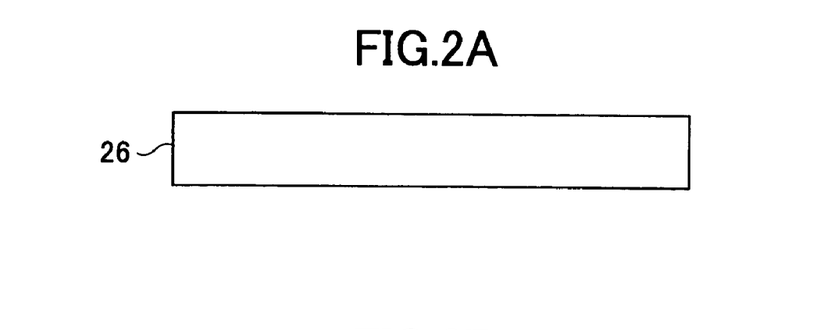
FIGS. 2A, 2B, 2C, 2D, 2E, 2F, 2G, 2H, 2I and 2J are schematic diagrams for explaining a manufacturing method of a semiconductor device substrate, a semiconductor device substrate, and a semiconductor device according to a first embodiment of the present invention.
Figure 2B:
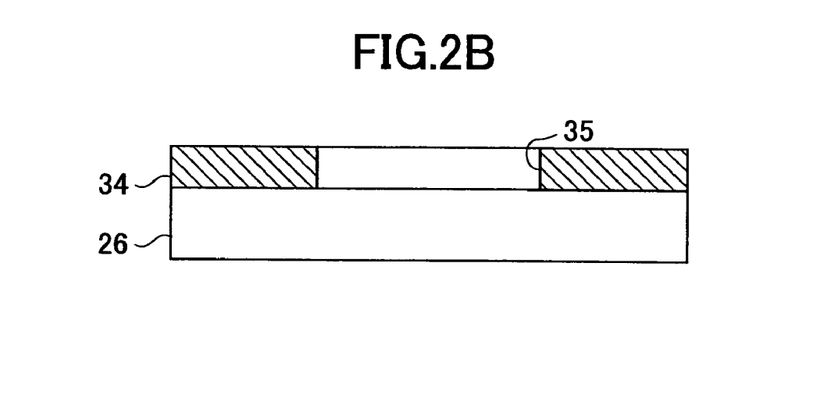
Figure 2C:
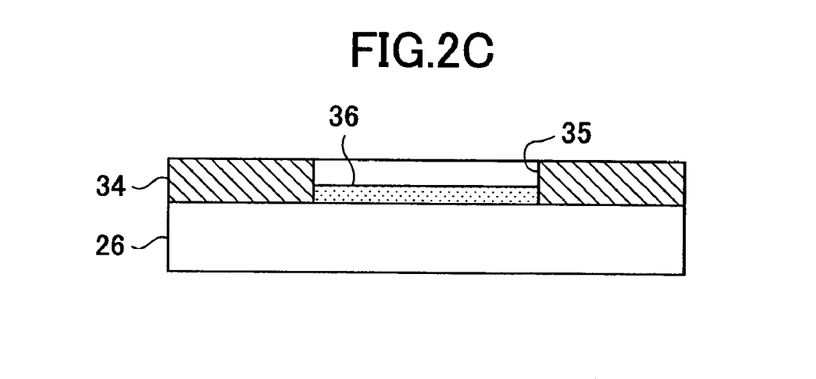
Figure 2D:
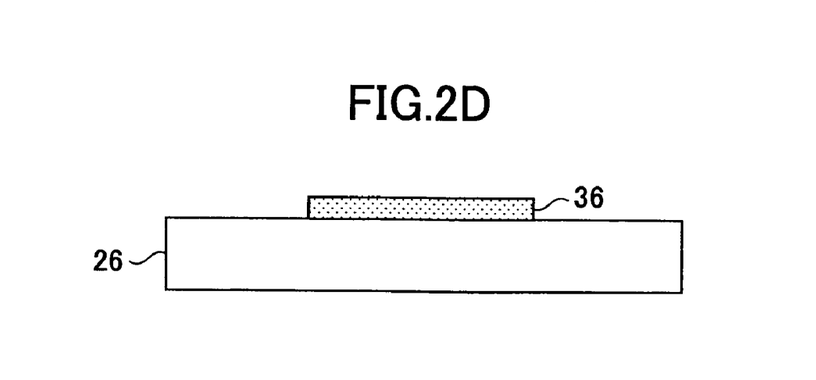
Figure 2E:
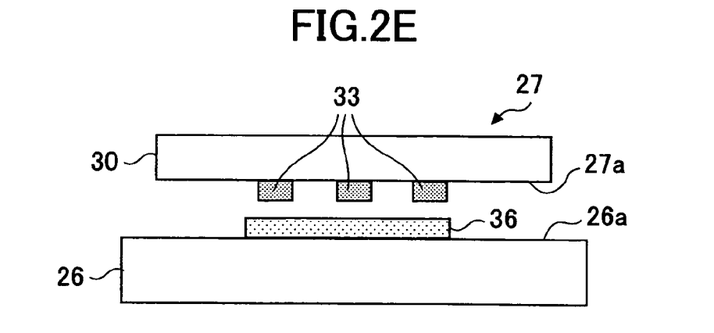
Figure 2F:
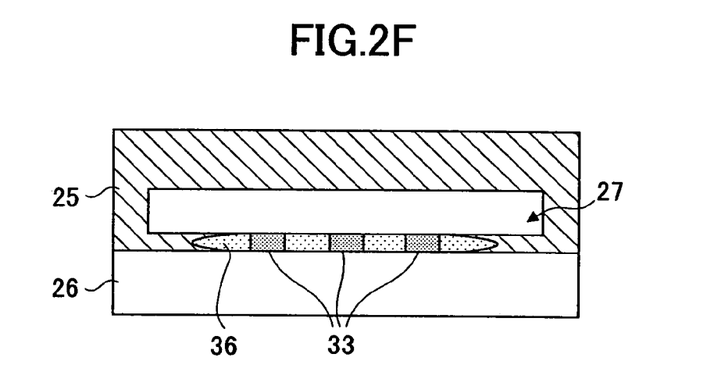
Figure 2G:
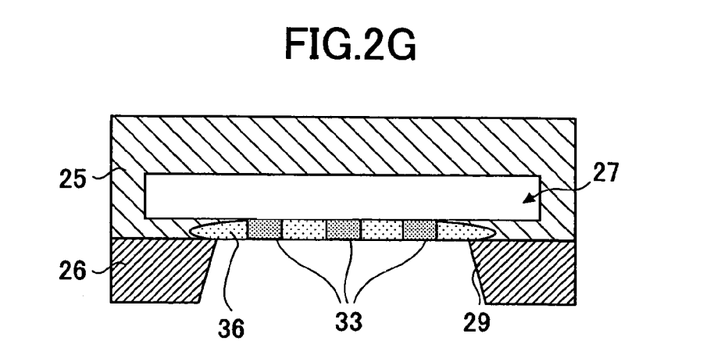
Figure 2H:
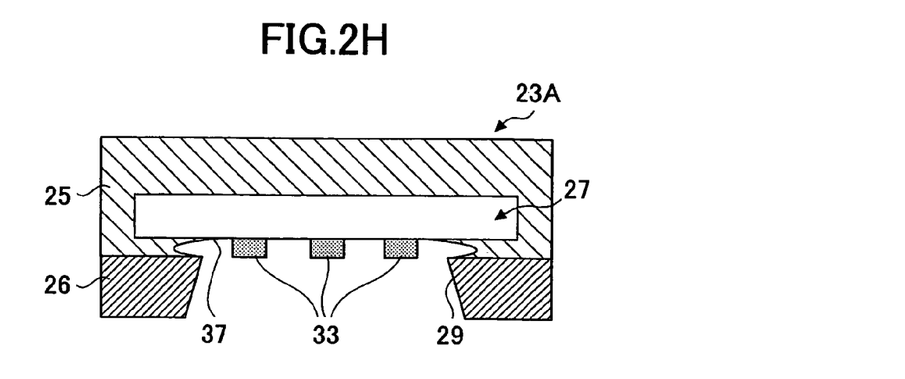
Figure 2I:
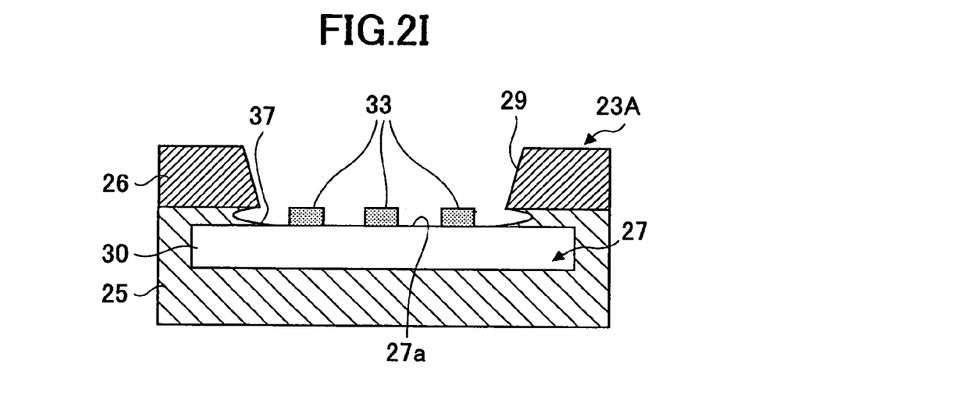
Figure 2J:
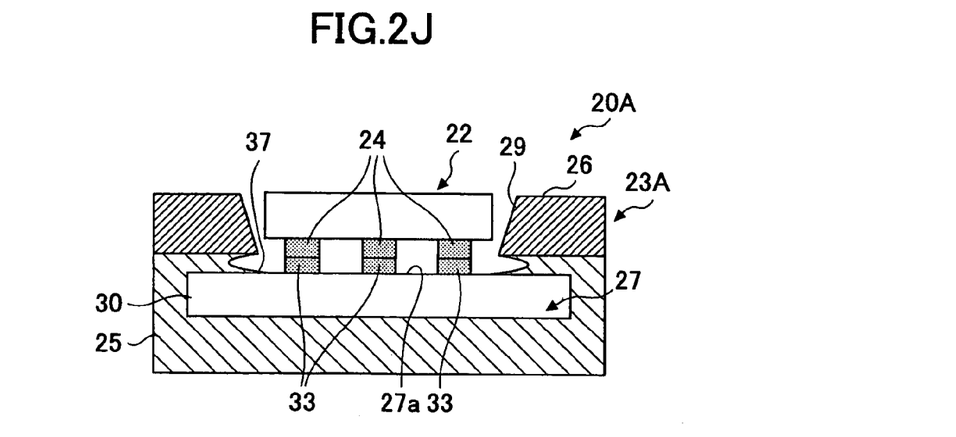
Figure 6:
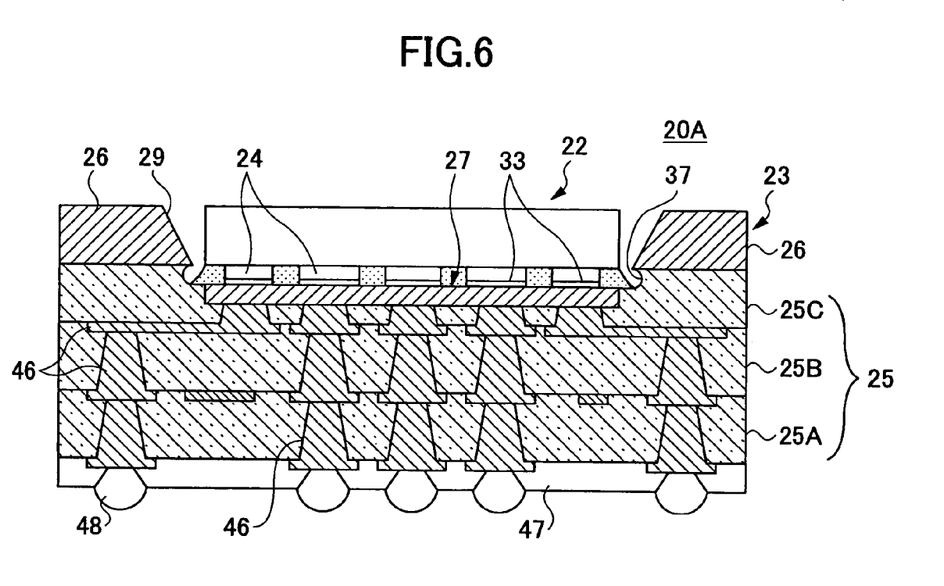
FIG. 6 is a schematic diagram showing the semiconductor device according to the first embodiment of the present invention in an enlarged manner.
Figure 7:
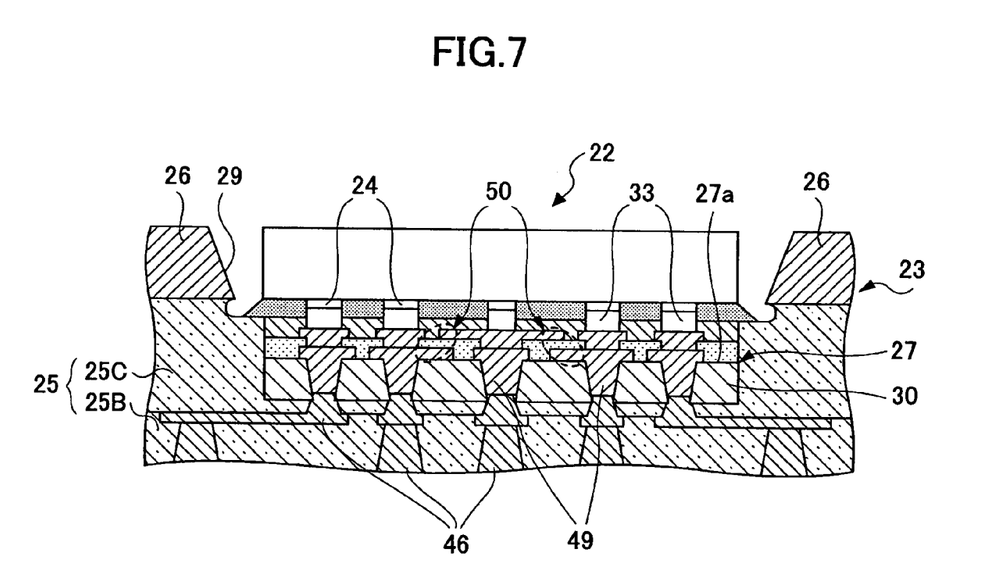
FIG. 7 is a schematic diagram showing greater detail of an electronic component mounted in the semiconductor device according to the first embodiment of the present invention in an enlarged manner.

FIGS. 2A through 2J are schematic diagrams for explaining a manufacturing method of a semiconductor device substrate (a substrate for a semiconductor device)(hereinafter simply referred to as a "substrate") 23A, the substrate 23A, and a semiconductor device 20A according to a first embodiment of the present invention. FIGS. 2A through 2H show the manufacturing method of the substrate 23A. FIG. 2I shows the substrate 23A. FIGS. 2J, 6 and 7 show the semiconductor device 20A.

Referring to FIGS. 2I, 2J, 6 and 7, a description is given below of the structures of the substrate 23A and the semiconductor device 20A according to this embodiment. As shown in FIGS. 2J, 6 and 7, the semiconductor device 20A generally includes the substrate 23A, and a semiconductor element 22 mounted in an opening 29 formed in the substrate 23A.

The substrate 23A includes a substrate body 25, a base 26, and an electronic component 27. As shown in FIG. 6 in an enlarged manner, the substrate body 25 is formed by stacking a plurality of (three, in the exemplary embodiment shown in FIG. 6) insulating resin members 25A through 25C and internal wiring layers 46 (including vias) by a build-up method on one side of the base 26. Solder balls 48 for external connection, which are connected to the internal wiring layers 46, are formed on the side of the substrate body 25 that is opposite to a surface on which the semiconductor element 22 is mounted. In FIG. 6, a reference numeral 47 designates a protective film.

The base 26 is provided for supporting the substrate body 25. The base 26 is formed by a metal (copper, for example) having a mechanical strength greater than that of the insulating resin members 25A through 25C, which form a major portion of the substrate body 25. The opening 29 is formed in the base 26 at the position where the semiconductor element 22 is mounted.

In this embodiment, the electronic component 27 is a capacitor. As shown in FIG. 7 in an enlarged manner, capacitor elements 50, bumps 33, which serve as electrodes, and the like are formed on a silicon core 30 to form the electronic component 27. The capacitor element 50 is formed on a surface (hereinafter referred to as an "element forming surface") 27a of the silicon core 30.

The electronic component 27 is mounted on the substrate body 25 with a part of the electronic component 27 embedded in the substrate body 25. However, since a concave portion 37 (FIG. 6) is formed in the substrate body 25 as is described below, the bumps 33 are exposed at the substrate body 25. Thus, the bumps 33 project from the element forming surface 27a.

Bumps 24 are formed on a circuit forming surface of the semiconductor element 22 (a bottom surface of the semiconductor element 22 shown in FIG. 2J). The bumps 24 may be, for example, solder bumps, gold bumps, and/or bumps made of another metal.

The semiconductor element 22 is inserted into the opening 29 formed in the base 26, and fixed to the substrate 23A by bonding the bumps 24 to the bumps 33. In the semiconductor device 20A according to this embodiment, the semiconductor element 22 is flip-chip bonded to the substrate 23A.

By bonding the semiconductor element 22 to the electronic component 27 in the aforementioned manner, the electronic component 27 functions as a decoupling capacitor. Accordingly, it is possible to stabilize by the electronic component 27 a power supply voltage supplied to the semiconductor element 22. Hence, it is possible to improve reliability of the semiconductor device 20.

The electronic component 27 is arranged beneath the semiconductor element 22. Hence, the distances of conductive channels between the semiconductor element 22 and the capacitor elements 50 (FIG. 7) are short, and an inductance thereof is small. Thus, even if the operational frequency of the semiconductor element 22 is increased, it is possible to stabilize the power supply voltage supplied to the semiconductor element 22 with little or no affect by the inductance.

In the illustrated exemplary embodiment, when flip-chip bonding the semiconductor element 22 to the substrate 23A, since the concave portion 37 is formed in the substrate body 25, the bumps 33 project from the element forming surface 27a. Hence, bonding may be obtained between the bumps 33 and the semiconductor element 22. More particularly, it is possible to directly connect the bumps 24 of the semiconductor element 22 to the bumps 33 of the electronic component 27.

That is, it is possible for the substrate 23A and the semiconductor device 20A according to this embodiment to eliminate the need for the connecting terminals 8 and the conductive members 12. Hence, it is possible to reduce impedance between the semiconductor element 22 and the electronic component 27, and improve electric properties of the semiconductor device 20A.

The capacitor elements 50 formed on the silicon core 30 of the electronic component 27 are electrically connected to a surface opposite to the element forming surface 27a via penetrating vias 49 formed to penetrate the silicon core 30. The penetrating vias 49 are connected to the vias formed in the substrate body 25 and serving as internal wiring, and external connection is made by the vias formed in the substrate body 25.

A description is given below of the manufacturing method of the substrate 23A having the above-mentioned configuration. When manufacturing the substrate 23A, the base 26 is prepared as shown in FIG. 2A. The base 26 is formed by a metal such as copper having a mechanical strength greater than that of the substrate body 25.

As shown in FIG. 2B, an insulating member 34 having an opening pattern 35 is formed on a top surface of the base 26. The formation position of the opening pattern 35 is set to correspond to the position where the bumps 33 of the electronic component 27 are to be bonded.

Subsequently, by performing a plating process, a metal material 36, which serves as a temporary fixing member, is formed in the opening pattern 35 formed in the insulating member 34. An electrolytic plating method or an electroless plating method, for example, may be used in the plating process. It is preferable to use a low-melting material, a brazing material, for example, as a material of the metal material 36. Tin (Sn), for example, may be used as a material of the metal material 36.

When the metal material 36 is formed with a predetermined shape on the base 26 by the plating process, the insulating member 34 is removed as shown in FIG. 2D. Consequently, the metal material 36 is arranged on the base 26 at the position where the bumps 33 of the electronic component 27 are to be bonded.

Subsequently, as shown in FIG. 2E, the electronic component 27 is mounted on the base 26 on which the metal material 36 is formed. In the illustrated exemplary embodiment, the metal material 36 is melted or softened by performing a heating process, and the electronic component 27 is pressed against the base 26. As a result, the bumps 33 push aside the metal material 36 and abut a surface 26a of the base 26.

By performing a cooling process under the above-mentioned state, the metal material 36 is cured again and holds the bumps 33. Thus, the electronic component 27 is temporarily fixed to the base 26 by the metal material 36. In the illustrated exemplary embodiment, since the bumps 33 formed on the electronic component 27 abut the surface 26a, the degree of parallelization of the electronic component 27 with respect to the base 26 is maintained.

Referring to FIG. 2F, when the electronic component 27 is temporarily fixed to the base 26 in the aforementioned manner, a formation process of the substrate body 25 is subsequently performed on the base 26. The formation process of the substrate body 25 is performed by stacking vias and insulating resin members on one side of the base 26 by a build-up method, while using as a core substrate the base 26 on which the electronic component 27 is arranged.

In accordance with the present invention, since the electronic component 27 is temporarily fixed to the base 26, it is possible to positively perform the formation process of the substrate body 25. In addition, since the electronic component 27 is temporarily fixed to the base 26 with a good accuracy, it is possible to positively electrically connect the vias (not shown) formed in the substrate body 25 to the penetrating vias (not shown) formed in the electronic component 27.

When the substrate body 25 is formed on the base 26 in the aforementioned manner, resist is subsequently formed on the base 26 except for the portion where the opening 29 is to be formed (opening forming portion). By using the resist as a mask, an etching process is performed on the base 26. Consequently, as shown in FIG. 2G, the opening 29 is formed in the base 26. With such a state, the metal material 36 and the bumps 33 are exposed at the opening 29 to form a substantially uniform surface.

Subsequently, as shown in FIG. 2H, an etching process for removing the metal material 36 is performed. An etchant that in the exemplary embodiment dissolves Tin (Sn) is selected as the etchant in the etching process. Hence, the metal material 36 is removed, thereby leaving the bumps 33 and the silicon core 30.

By performing the series of processes mentioned above, the substrate 23A is manufactured, and the semiconductor element 22 may be mounted thereon (connected thereto). FIG. 2I shows a state where the substrate 23A is completed. As shown in FIG. 2I, by removing the metal material 36, the concave portion 37 is formed in the substrate body 25. Additionally, formation of the concave portion 37 results in projection of the bumps 33 of the electronic component 27 from the element forming surface 27a. Accordingly, as mentioned above, it is possible to improve bonding and reliability in mounting the semiconductor element 22 on the substrate 23A.

As mentioned above, in this embodiment, when arranging the electronic component 27 on the base 26, instead of forming the connecting terminals 8 on the base 6 and fixing the electronic component 7 to the connecting terminals 8 by soldering (refer to FIGS. 1A through 1H), according to the exemplary embodiment of the present invention, a method is used in which the electronic component 27 is temporarily fixed to the base 26 by using the metal material 36 serving as the temporary fixing member.

The manufacturing method according to this embodiment eliminates the need for the process of forming the connecting terminals 8. Thus, it is possible to simplify the manufacturing processes of the substrate. In addition, the processes for positioning the connecting terminals 8 and the bumps 13 are also eliminated, which also simplifies the manufacturing processes of the substrate. Further, in this embodiment, the bumps 33 are temporarily fixed to the base 26 by making the bumps 33 directly abut the base 26. Hence, it is easy to correspond to the semiconductor element 22 having a higher density (that is, the bumps 33 arranged with a higher density).

In the above-mentioned embodiment, Tin (Sn) is used as the metal material 36, which serves as the temporary fixing member. However, Tin is not a limitation of the metal material 36, and various metals may be used. In order to perform the temporary fixing process easily, it is preferable that a low-melting material such as solder is selected as the metal material 36. Additionally, it is preferable for the metal material 36 to be easily removed without affecting the bumps 33 and the electronic component 27 and without leaving residue in the process for removing the metal material 36.

Next, a description is given below of a second embodiment of the present invention.

Figure 3A:
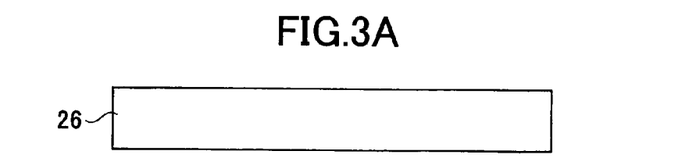
FIGS. 3A, 3B, 3C, 3D, 3E, 3F, 3G, 3H, and 3I are schematic diagrams for explaining a manufacturing method of a semiconductor device substrate, a semiconductor device substrate, and a semiconductor device according to a second embodiment of the present invention.
Figure 3B:
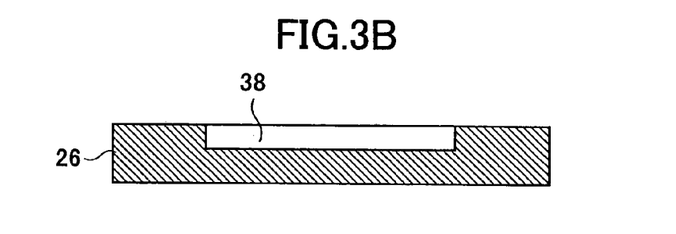
Figure 3C:
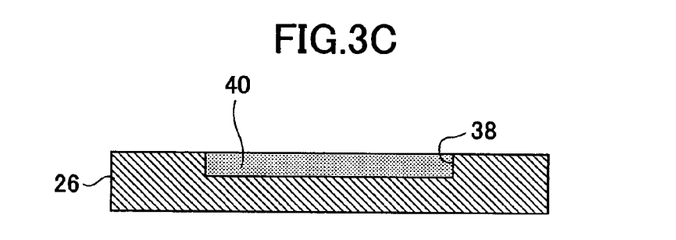
Figure 3D:
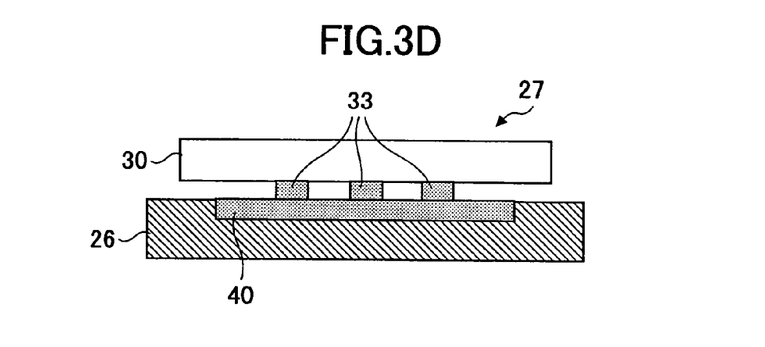
Figure 3E:
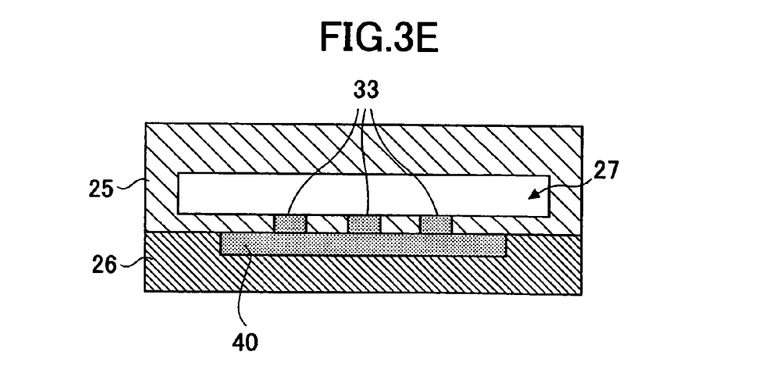
Figure 3F:
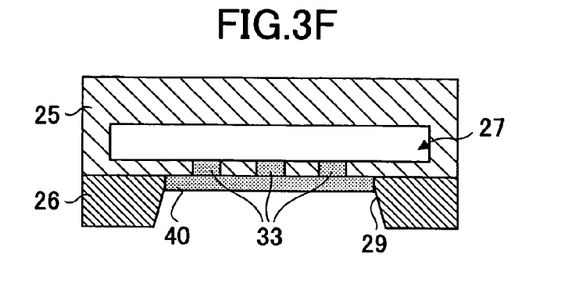
Figure 3G:
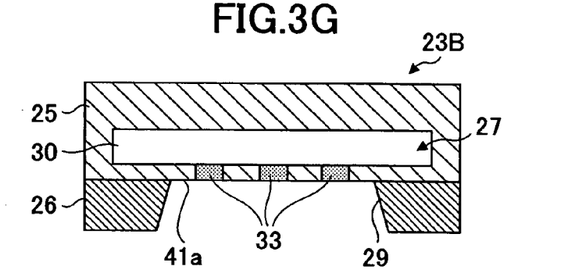
Figure 3H:
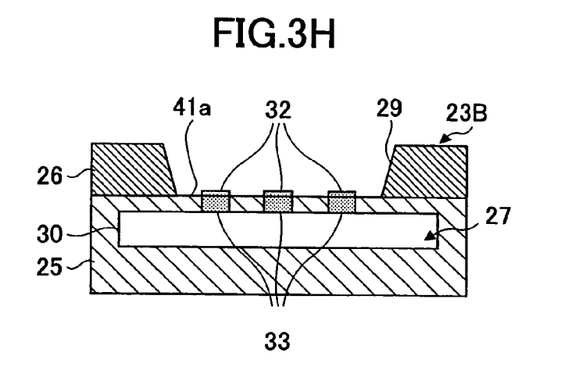
Figure 3I:
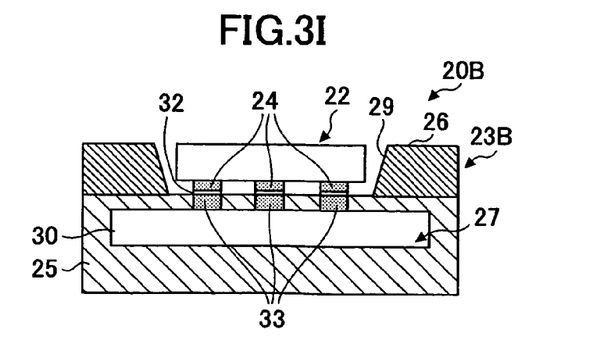

FIGS. 3A through 3I are diagrams for explaining a substrate 23B, a semiconductor device 20B, and a manufacturing method of the substrate 23B. FIGS. 3A through 3G show the manufacturing method of the substrate 23B. FIG. 3H shows the substrate 23B, and FIG. 3I shows the semiconductor device 20B.

In FIGS. 3A through 3I, referred to for explaining the second embodiment, and FIGS. 4 and 5, referred to in a description of third and following embodiments of the present invention, those parts that are the same as those corresponding parts in FIGS. 2A through 2J are designated by the same reference numerals, and a description thereof is omitted.

In the above-mentioned first embodiment, the metal material 36 (Tin) is used as the temporary fixing member that fixes the electronic component 27 to the base 26. On the other hand, in the second embodiment, a sheet member is used as the temporary fixing member. For example, a water-soluble sheet 40 may be used as the sheet member.

A description is given below of the manufacturing method of the substrate 23B according to the second embodiment.

In the second embodiment, after preparing the base 26 as shown in FIG. 3A, a cavity (depression) 38 is formed in the base 26 as shown in FIG. 3B by, for example, spot facing or etching. The formation portion of the cavity 38 is set to correspond to the portion where the bumps 33 of the electronic component 27 is to be bonded.

As shown in FIG. 3C, the water-soluble sheet 40 is arranged in the cavity 38. PVA (polyvinyl alcohol) or No. 509A manufactured by Nitto Denko Corporation may be used as the water-soluble sheet 40, for example. Each of such above-mentioned water-soluble sheets has adhesion properties and characteristics of being dissolved into water when dipped into water. Since the water-soluble sheet 40 has adhesion properties, the water-soluble sheet 40 adheres to the base 26 (in the cavity 38) while being arranged in the cavity 38.

When the water-soluble sheet 40 is arranged on the base 26 in the aforementioned manner, the electronic component 27 is mounted on the base 26 as shown in FIG. 3D. Consequently, the bumps 33 of the electronic component 27 abut the water-soluble sheet 40. As mentioned above, the water-soluble sheet 40 has adhesive properties. Hence, when the bumps 33 abut the water-soluble sheet 40, the electronic component 27 is temporarily fixed to the base 26 via the water-soluble sheet 40.

When the electronic component 27 is temporarily fixed to the base 26 in the aforementioned manner, the substrate body 25 is formed on the base 26 (FIG. 3E). The opening 29 is then formed in the base 26 (FIG. 3F) as in the first embodiment. With such a state, the water-soluble sheet 40 is exposed at the opening 29, and the bumps 33 are covered by the water-soluble sheet 40.

Subsequently, a process is performed in which the base 26, which exposes the water-soluble sheet 40 at the opening 29, is dipped into water, thereby removing the water-soluble sheet 40. By performing the series of processes mentioned above, the substrate 23B is manufactured, and the semiconductor element 22 may be mounted thereon (connected thereto). FIG. 3G shows a state where the substrate 23B is completed.

In the removing process of the water-soluble sheet 40, the water-soluble sheet 40 should be merely dipped into water. Thus, it is possible to perform the removing process easily. Additionally, since the solvent for the water-soluble sheet 40 is water, the substrate body 25, the electronic component 27, and the bumps 33 are not deleteriously affected. Further, it is not necessary to perform a heating process when temporarily fixing the electronic component 27 to the water-soluble sheet 40 and when dissolving the water-soluble sheet 40 into water. Hence, it is possible to prevent the electronic component 27 from being damaged due to heat.

As shown in FIG. 3G, the bumps 33 are exposed by removing the water-soluble sheet 40. In the illustrated exemplary embodiment, the tops of the bumps 33 form a substantially uniform surface with an exposed surface 41a of the substrate body 25. Hence, when mounting the semiconductor element 22, conductive members 32 (solders, for example) are formed on the bumps 33 as shown in FIG. 3H so as to enable bonding between the bumps 24 of the semiconductor element 22 and the bumps 33 of the electronic component 27. Then, the semiconductor element 22 is mounted on the substrate 23B via the conductive members 32.

The manufacturing method according to the second embodiment also eliminates the need for the connecting terminals 8. Accordingly, it is possible to simplify the manufacturing process of the substrate, and easily correspond to a semiconductor element 22 having a higher density (that is, the bumps 33 arranged with a higher density).

A description is given below of a third embodiment of the present invention.

Figure 4A:
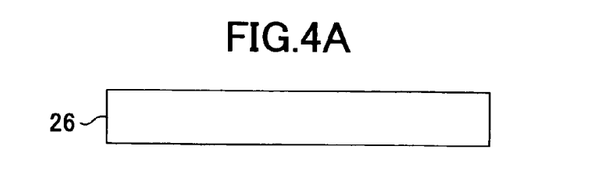
FIGS. 4A, 4B, 4C, 4D, 4E, 4F, 4G, 4H, and 4I are schematic diagrams for explaining a manufacturing method of a semiconductor device substrate, a semiconductor device substrate, and a semiconductor device according to a third embodiment of the present invention.
Figure 4B:
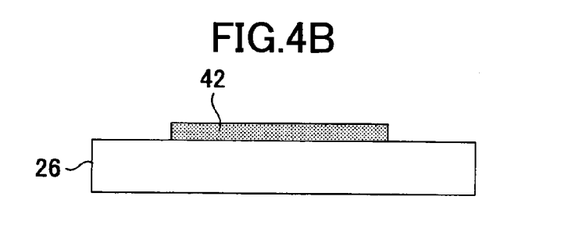
Figure 4C:
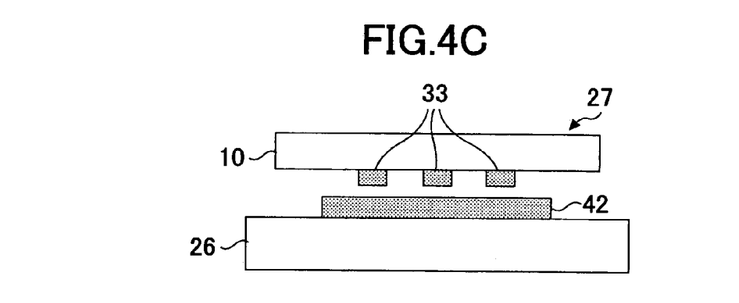
Figure 4D:
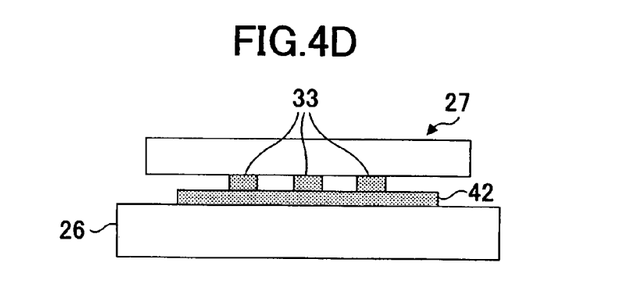
Figure 4E:
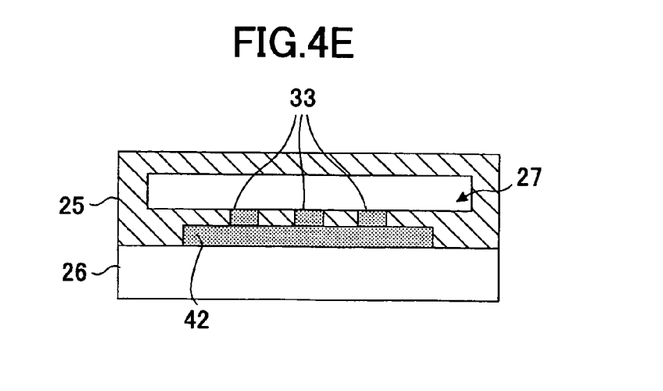
Figure 4F:
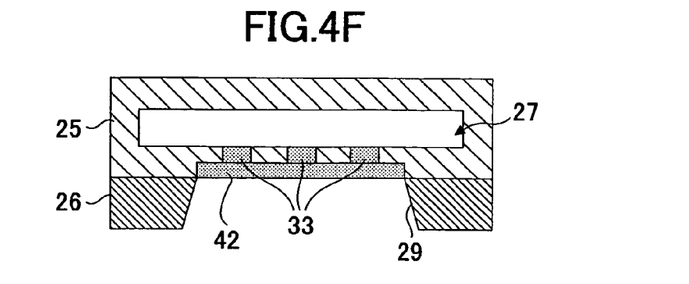
Figure 4G:
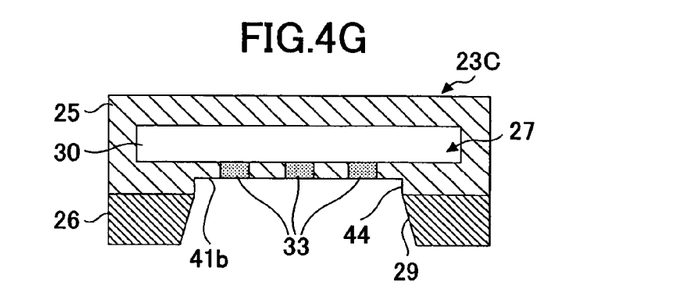
Figure 4H:
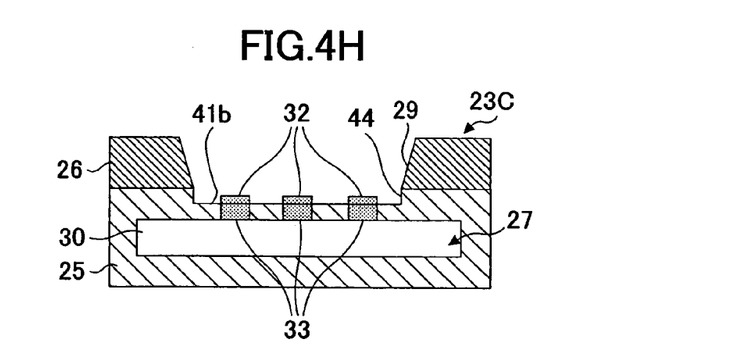
Figure 4I:
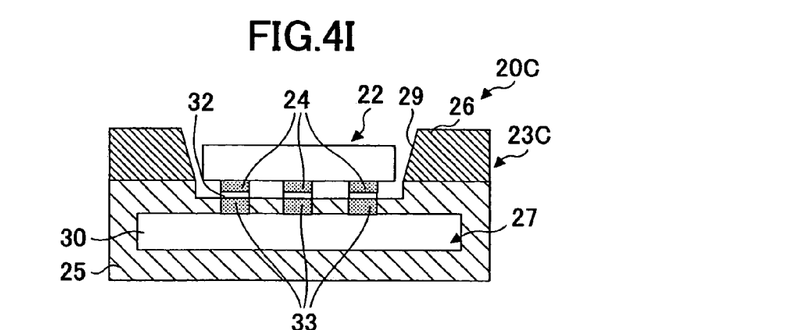

FIGS. 4A through 4I are diagrams for explaining a substrate 23C, a semiconductor device 20C, and a manufacturing method of the substrate 23C according to the third embodiment of the present invention. FIGS. 4A through 4G show the manufacturing method of the substrate 23C. FIG. 4H shows the substrate 23C, and FIG. 4I shows the semiconductor device 20C.

The manufacturing method according to the third embodiment uses a sheet member as the temporary fixing member as in the second embodiment. In the second embodiment, the cavity 38 is formed in the base 26, and the water-soluble sheet 40, which is the sheet member, is arranged in the cavity 38. In the third embodiment, however, the cavity 38 is not formed and a sheet member is arranged on the base 26.

A description is given below of the manufacturing method of the substrate 23C according to the third embodiment.

In the third embodiment, after preparing the base 26 as shown in FIG. 4A, a sheet member 42 is arranged on a top surface of the base 26 as shown in FIG. 4B. In this embodiment, a thermo-peeling tape (thermal release tape) 42 is used as the sheet member that serves as the temporary fixing member.

The thermo-peeling tape 42 is a sheet member (tape member) that has adhesive properties at normal temperatures and has characteristics that the adhesive properties are degraded when subjected to a heating process (at 170° C., for example). "Revalpha (product name)" manufactured by Nitto Denko Corporation, for example, may be used as the thermo-peeling tape 42. As mentioned above, since the thermo-peeling tape 42 has adhesive properties at normal temperatures, the thermo-peeling tape 42 adheres to the base 26 while being arranged on the base 26.

When the thermo-peeling tape 42 is arranged on the base 26 in the aforementioned manner, the electronic component 27 is mounted on the base 26 as shown in FIGS. 4C and 4D. Consequently, the bumps 33 of the electronic component 27 abut the thermo-peeling tape 42. As mentioned above, the thermo-peeling tape 42 has the adhesive properties. Thus, when the bumps 33 abut the thermo-peeling tape 42, the electronic component 27 is temporarily fixed to the base 26 via the thermo-peeling tape 42.

When the electronic component 27 is temporarily fixed to the base 26 in the aforementioned manner, the substrate body 25 is formed on the base 26 (FIG. 4E). The opening 29 is then formed in the base 26 (FIG. 4F) as in each of the above-mentioned embodiments. With such a state, the thermo-peeling tape 42 is exposed at the opening 29, and the bumps 33 are covered by the thermo-peeling tape 42.

Subsequently, a heating process is performed at approximately 170° C. or other temperature depending on the particular thermo-peeling tape used, thereby reducing the adhesion force of the thermo-peeling tape 42, and separating the thermo-peeling tape 42 from the substrate body 25. Since the adhesive force of the thermo-peeling tape 42 is reduced by the heating process, it is possible to easily perform separation of the thermo-peeling tape 42. By performing the series of processes mentioned above, the substrate 23C is manufactured, and the semiconductor element 22 may be mounted thereon (connected thereto). FIG. 4G shows a state where the substrate 23C is completed.

As shown in FIG. 4G, by separating the thermo-peeling tape 42, a stage portion 44 is formed in the substrate body 25, and the bumps 33 are exposed at an exposed surface 41*b* of the substrate body 25. In the illustrated exemplary embodiment, the tops of the bumps 33 form a substantially uniform surface with the exposed surface 41*b* of the substrate body 25. Hence, also in this embodiment, as shown in FIG. 4H, the conductive members (solders, for example) 32 are formed on the bumps 33, and the semiconductor element 22 is mounted on the substrate 23C via the conductive members 32.

The manufacturing method according to this embodiment also eliminates the need for the connecting terminals 8. Hence, it is possible to simplify the manufacturing process of the substrate, and easily correspond to a semiconductor element 22 having a higher density (that is, the bumps 33 arranged with a higher density).

In the second and third embodiments mentioned above, the description is given of the cases where the water-soluble sheet 40 and the thermo-peeling tape 42 are used as the sheet member, respectively. However, the above-mentioned sheets are not limitations of the sheet member, and other sheet members may be used such as a UV tape whose adhesive force is reduced when subjected to ultraviolet light. Additionally, the method for removing the sheet member is not limited to dipping the sheet member into water and heating the sheet member, as other methods may be used such as removing by laser beam machining and removing by dry etching.

A description is given below of a fourth embodiment of the present invention.

Figure 5A:
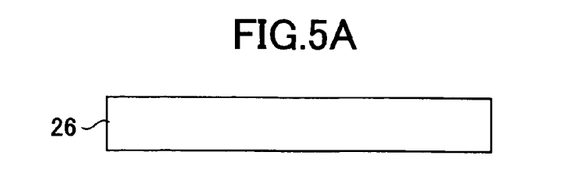
FIGS. 5A, 5B, 5C, 5D, 5E, 5F, 5G, 5H and 5I are schematic diagrams for explaining a manufacturing method of a semiconductor device substrate, a semiconductor device substrate, and a semiconductor device according to a fourth embodiment of the present invention.
Figure 5B:
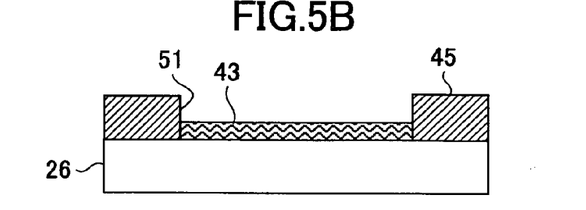
Figure 5C:
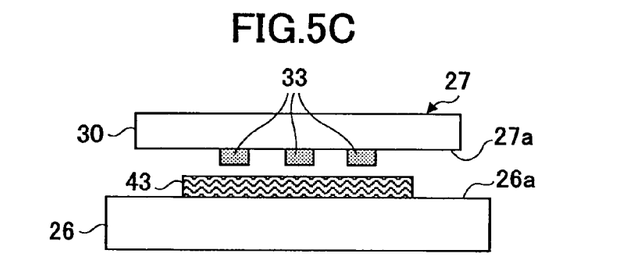
Figure 5D:
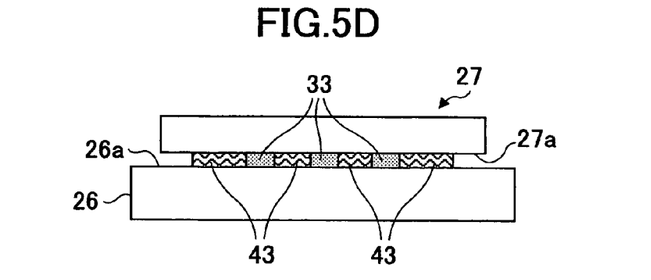
Figure 5E:
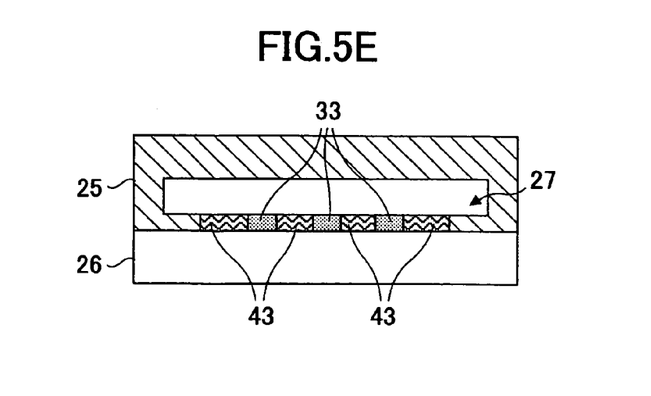
Figure 5F:
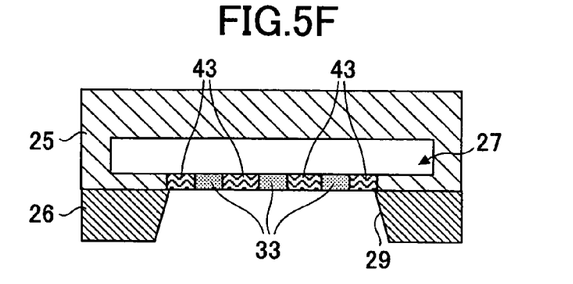
Figure 5G:
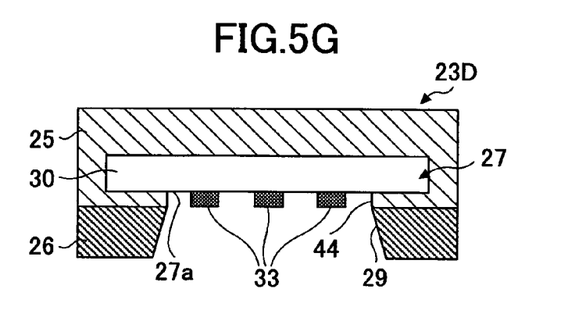
Figure 5H:
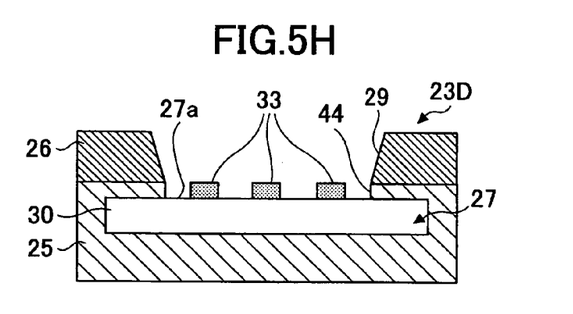
Figure 5I:
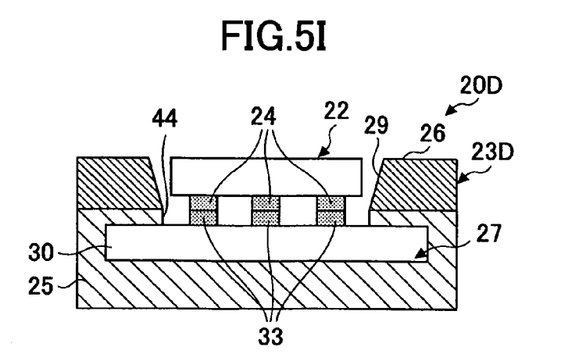

FIGS. 5A through 5I are diagrams for explaining a substrate 23D, a semiconductor device 20D, and a manufacturing method of the substrate 23D according to the fourth embodiment. FIGS. 5A through 5G show the manufacturing method of the substrate 23D. FIG. 5H shows the substrate 23D, and FIG. 5I shows the semiconductor device 20D.

The manufacturing method according to this embodiment uses a liquid adhesive 43 as the temporary fixing member. In this embodiment, a spray glue 43 is used as the liquid adhesive, which serves as the temporary fixing member.

A description is given below of the manufacturing method of the substrate 23D.

In this embodiment, after preparing the base 26 as shown in FIG. 5A, a mask 45 is formed on a top surface of the base 26 as shown in FIG. 5B. Then, the spray glue 43 is provided in an opening pattern 51 formed by the mask. It is preferable that the amount of the spray glue 43 to be provided is such an amount by which the bumps 33 are positively embedded therein, and the spray glue 43 does not overflows when the electronic component 27 is mounted on the base 26 as shown in FIG. 5D.

In the exemplary embodiment, the spray glue 43 is a liquid adhesive having acrylic rubber as its principal component, for example. By spraying the spray glue 43 toward the mask 45 by using a spray apparatus, the spray glue 43 is deposited in the opening pattern 51. In accordance with the present invention, by suitably setting the arranging position and the shape of the opening pattern 51, it is possible to provide the spray glue 43 to an arbitrary portion of the base 26.

When the spray glue 43 is provided for the base 26 in the aforementioned manner, the mask 45 is removed. Then, as shown in FIGS. 5C and 5D, the electronic component 27 is mounted on the base 26. Consequently, the bumps 33 of the electronic component 27 enter the spray glue 43 and abut the surface 26*a* of the base 26.

Since the spray glue 43 has adhesive properties, when the bumps 33 enter and push aside the spray glue 43, and the spray glue 43 contacts the element forming surface 27*a* of the electronic component 27, the electronic component 27 is temporarily fixed to the base 26 via the spray glue 43.

When the electronic component 27 is temporarily fixed to the base 26 in the aforementioned manner, the substrate body 25 is formed on the base 26 (FIG. 5E). The opening 29 is then formed in the base 26 (FIG. 5F) as in each of the above-mentioned embodiments. With such a state, the spray glue 43 and the tops of the bumps 33 are exposed at the opening 29.

The base 26 is dipped into a solvent of ethanol or acetone, for example, and preferably ultrasonic cleaning is performed thereon. Consequently, the spray glue 43 is washed away and removed from the substrate body 25 and the electronic component 27. By performing the series of processes mentioned above, the substrate 23D is manufactured. FIG. 5G shows a state where the substrate 23D is completed.

As shown in FIG. 5G, by removing the spray glue 43, the stage portion 44 is formed in the substrate body 25, and the bumps 33 project from the element forming surface 27*a* of the substrate body 25. Accordingly, when mounting the semiconductor element 22 on the substrate 23D, it is possible to directly bond the bumps 24 and the bumps 33. Hence, it is possible to improve bonding and reliability.

The manufacturing method according to this embodiment also eliminates the need for the connecting terminals 8. Hence, it is possible to simplify the manufacturing process of the substrate, and easily correspond to the semiconductor element 22 having a higher density (that is, the bumps 33 arranged with a higher density).

In each of the above-mentioned embodiments of the manufacturing method of a substrate, the description is given by taking as examples the manufacturing methods of the semiconductor device substrates 23A through 23D on which the semiconductor element 22 is mounted. However, application of the manufacturing method of a substrate according to the present invention is not limited to a semiconductor device substrate. As will be appreciated, the manufacturing method of a substrate according to the present invention may be applied to manufacturing of a substrate on which the semiconductor element 22 is not mounted.

Additionally, in the above-mentioned embodiments, the electrodes of the electronic component 27 are bumps. However, the present invention may be applied to a case where the electrodes of the electronic component 27 are formed by other than bumps, as will be appreciated.

Further, in the above-mentioned embodiments, the opening 29 is formed, thereby leaving the base 26 except for the formation portion of the opening 29. However, the base 26 may be completely removed.

According to the present invention, it is possible to achieve various effects.

In an embodiment of the present invention, when mounting the electronic component 27 on the base 26, instead of fixing the electronic component 27 to the base 26 by soldering as in conventional methods, the electronic component 27 is temporarily fixed to the base by using the temporary fixing member (for example, 36, 40, 42, 43). Additionally, the temporary fixing member (for example, 36, 40, 42, 43), which is used for temporarily fixing the electronic component 27 to the base 26, is removed after the opening 29 is formed in base 26 at the arranging portion of the electronic component 27. Hence, the need for providing the base 26 with the connecting terminals 8 for soldering is eliminated, and the need for positioning the connecting terminals 8 and the electronic component 27 is also eliminated. Accordingly, it is possible to easily manufacture a substrate (for example, 23A, 23B, 23C, 23D).

In an embodiment of the present invention, the electrodes of the electronic component 27 may project from the surface of the substrate body 25. Hence, it is possible to directly connect the electrodes to the semiconductor element 22. Accordingly, it is possible to reduce impedance between the electronic component 27 and the semiconductor element 22, and improve electric properties of the semiconductor device (for example, 20A, 20B, 20C, 20D).

The present invention is not limited to the specifically disclosed embodiments, and variations and modifications may be made without departing from the scope of the present invention.

The present application is based on Japanese priority application No. 2003-104070 filed on Apr. 8, 2003, the entire contents of which are hereby incorporated by reference.

What is claimed is:

1. A method of manufacturing a semiconductor device substrate, said method comprising the steps of:
arranging on a base a temporary fixing member for temporarily fixing an electronic component;
temporarily fixing the electronic component on the base by using the temporary fixing member;
forming a substrate body on the base and the electronic component;
removing at least a portion of the base which portion corresponds to the electronic component, thereby exposing the temporary fixing member; and
removing the temporary fixing member, thereby enabling the electronic component to make an external connection.

2. The method as claimed in claim 1, wherein the temporary fixing member is made of a metal.

3. The method as claimed in claim 2, wherein the metal is a low-melting metal.

4. The method as claimed in claim 1, wherein the temporary fixing member is a sheet member configured to be able to bond the electronic component to the base.

5. The method as claimed in claim 4, wherein the sheet member is a thermo peeling tape.

6. The method as claimed in claim 4, wherein the sheet member is a water-soluble sheet.

7. The method as claimed in claim 4, wherein the sheet member is a UV tape.

8. The method as claimed in claim 1, wherein the temporary fixing member is a liquid adhesive.

9. The method as claimed in claim 1, wherein the step of removing at least the portion of the base removes the entire base.

* * * * *